(12) United States Patent
Sivard

(10) Patent No.: US 6,894,633 B2
(45) Date of Patent: May 17, 2005

(54) ULTRA LOW POWER ANALOG TO DIGITAL CONVERTER

(75) Inventor: Ake Sivard, Solna (SE)

(73) Assignee: Zarlink Semiconductor AB, Jarfalla (SE)

( * ) Notice: Subject to any disclaimer, the term of this patent is extended or adjusted under 35 U.S.C. 154(b) by 0 days.

(21) Appl. No.: 10/730,528

(22) Filed: Dec. 8, 2003

(65) Prior Publication Data

US 2004/0140921 A1 Jul. 22, 2004

(30) Foreign Application Priority Data

Dec. 21, 2002 (GB) .............................. 0229972

(51) Int. Cl.⁷ .............................................. H03M 1/12
(52) U.S. Cl. .................................... 341/155; 341/172
(58) Field of Search ............................ 341/155, 172, 341/136, 122, 161, 118, 165

(56) References Cited

U.S. PATENT DOCUMENTS

| 4,028,694 A | * | 6/1977 | Cook et al. .................. 341/136 |
| 4,353,057 A | * | 10/1982 | Bernet et al. ................ 341/136 |
| 4,779,617 A | | 10/1988 | Whigham |
| 5,543,795 A | | 8/1996 | Fernald |
| 5,606,320 A | * | 2/1997 | Kleks .......................... 341/161 |

FOREIGN PATENT DOCUMENTS

| EP | 0372526 A | 6/1990 |
| FR | 2798593 A | 3/2001 |
| JP | 08205253 A | 12/1996 |
| WO | WO 96/39739 | 12/1996 |

* cited by examiner

*Primary Examiner*—Patrick Wamsley
*Assistant Examiner*—Joseph Lauture
(74) *Attorney, Agent, or Firm*—Lawrence E. Laubscher, Jr.

(57) ABSTRACT

An analog-to-digital converter for ultra low power applications, such as pacemakers, has a digitizer for producing a digital output signal from a sampled analog input signal. The digitizer is normally in off state to save current. A sample-and-hold circuit stores a plurality of successive samples of the analog input signal. A control element turns on the digitizer in response to an activation signal, sequentially applies the stored samples to the digitizer in response to the activation signal and thus reconstructs the signal as it existed prior to the activation signal.

15 Claims, 1 Drawing Sheet

ULTRA LOW POWER ANALOG TO DIGITAL CONVERTER

BACKGROUND OF THE INVENTION

1. Field of the Invention

This invention relates to the field of analog-to-digital conversion, and in particular to an ultra low power analog-to-digital converter (ADC) for use in applications such as implantable devices where current consumption is a very important parameter.

2. Description of Related Art

In low power applications it is often not possible to afford the luxury of having a continuous ADC running. The analog signals of interest are filtered and amplified, and then compared to a threshold triggering level at which some action is taken, such as turning on the ADC. Unfortunately, the signal shape is often of interest shortly before and immediately after the triggering event. With prior art devices the signal shape before the trigger signal is lost even if the ADC is started immediately. The prior art does not provide a way of determining the shape of the signal prior to triggering of the ADC.

FIG. 1 illustrates a prior art ADC. An analog input signal, such as a heart signal, is fed through a pre-amplifier 10 to amplifier 11 with programmable gain, where it is split into two portions. Amplifier 11 can be programmed to allow for the fact that different people produce heart signals of different amplitude. One portion of the signal is passed to the input of the ADC 12, and another portion is passed to the bandpass filter 13, from where it is fed to comparator 14.

The ADC comprises a digitizing circuit 15 and sampling capacitor 16. The digitizing circuit 15 takes a sampled analog signal and produces a digital output signal in a manner well known in the art. If the filtered signal exceeds a threshold level, comparator 14 generates a trigger signal, in the form of an output pulse going high, that activates ADC 12, which outputs a digital signal at output 17. The input of the ADC 12 is connected to the sampling capacitor 16 through switch 18, which is normally turned off when the ADC is inactive. The sampling capacitor is connected to digitizing circuit 15 through switch 19 and provides a single sample-and-hold circuit that stores the current value of the analog input signal.

After processing, the digitized output signal is stored in RAM for later study by the doctor when the patient goes to hospital. However, since the ADC is not triggered until the threshold is reached, the initial portion of the signal of interest is lost. It is not possible to lower the trigger threshold since then the ADC would be continually activated unnecessarily.

SUMMARY OF THE INVENTION

According to the present invention there is provided an analog-to-digital converter, comprising a digitizer for producing a digital output signal from a sampled analog input signal; a sample-and-hold circuit for storing a plurality of successive samples of said input signal; and a control element for controlling switches to sequentially apply said stored samples to said digitizer in response to an activation signal and thus reconstruct said input signal as it existed immediately prior to said activation signal.

The invention is typically used in a pacemaker, where the input signal is a heart signal and this is stored in RAM for subsequent study by the physician. The sample-and-hold circuit preferably comprises an array of capacitors with associated switches. By using an array of capacitors instead of a single sampling capacitor for the ADC, the sample value can be fed into the digitizer with an appropriate delay depending on the number of capacitors and the sample rate. This enables the shape of the signal prior to ADC activation to be stored in the RAM. The circuitry required to sequentially store the analog signal in the array of capacitors consumes very little power.

The value is then sampled in sequence into each of the capacitors continuously, which take a negligible amount of current compared to the complete ADC. When the event of interest occurs, the digitizer is started and the oldest value is fed into the digitizer for processing followed by the second oldest etc. As soon as one capacitors value has been processed in the digitizer, a new sample is taken to keep a continuous sampling going if desired.

The output from the ADC will be the signal shape at a time k-1 samples prior the triggering event (where k equals the number of capacitors) and continuing after the trigger with the same delay for as long as desired. The small delay in receiving the digitized signal is not critical. The invention thereby enables the ADC to reconstruct the signal before the triggered on-set and this without any storing digital data.

The invention also provides a method of converting an analog signal to a digital signal, comprising feeding said analog signal to a sample-and-hold circuit; storing successive samples of said input signal in said sample-and-hold circuit; and sequentially applying said stored samples with a delay of at least one sample period to a digitizer in response to an activation signal, said digitizer producing a digital output signal from a sampled analog input signal which is a reconstruction of said input signal prior to said activation signal

BRIEF DESCRIPTION OF THE DRAWINGS

The invention will now be described in more detail, by way of example only, with reference to the accompanying drawings, in which.

DETAILED DESCRIPTION OF PREFERRED EMBODIMENT

Figure 2:
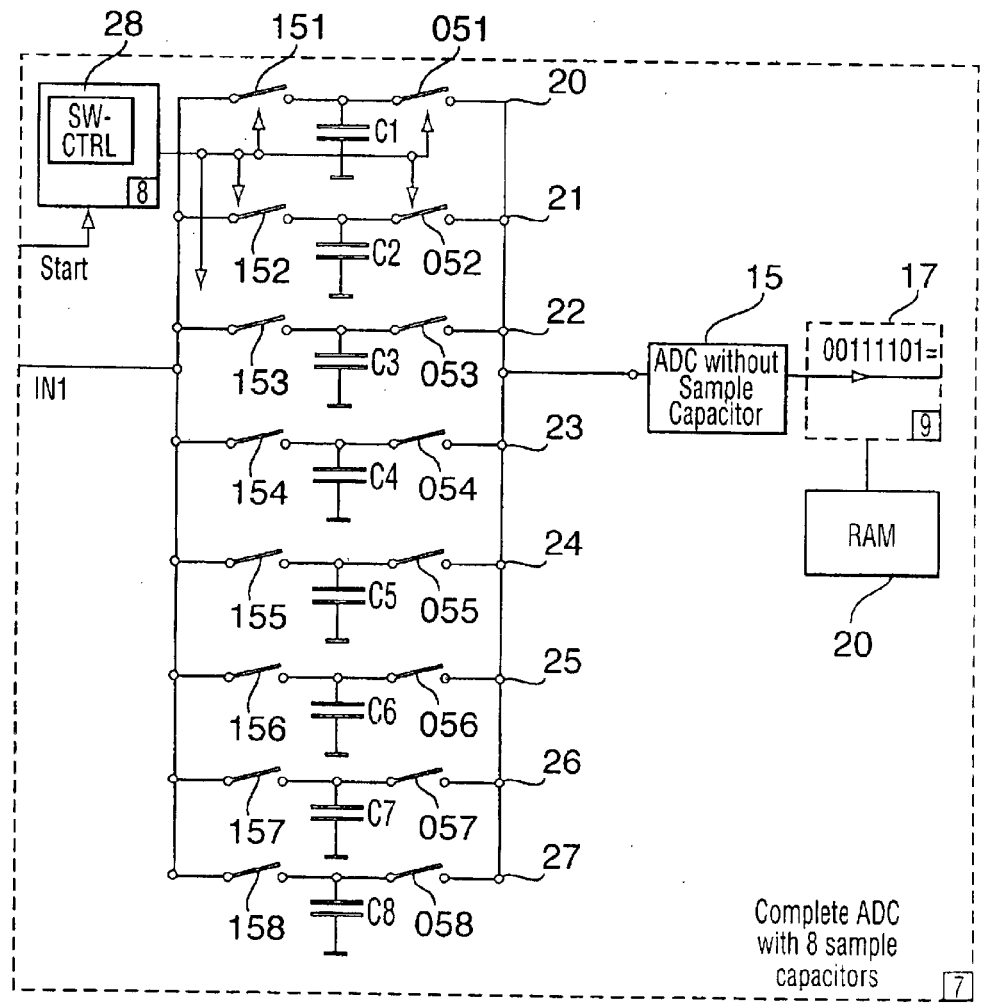
FIG. 2 is a block diagram of an analog-to-digital converter in accordance with one embodiment of the invention.

The analog-to-digital converter shown in FIG. 2 is, for example, suitable for use in a pacemaker where the spontaneous heart signal continually monitored. This is done to prevent the pacemaker from producing a stimulation pulse when it is not necessary. Examples of low power consumption analog-to-digital converters suitable for pacemakers and for this invention are single slope, dual slope, algorithmic, resistor chain based successive approximation and binary weighted capacitor based successive approximation. However the invention can be used in any analog-to-digital converter that samples the input. Suitable examples of such analog-to digital converters are found, for example, in Digital Signal Processing, Steven W. Smith, California Technical Publishing.

Figure 1:
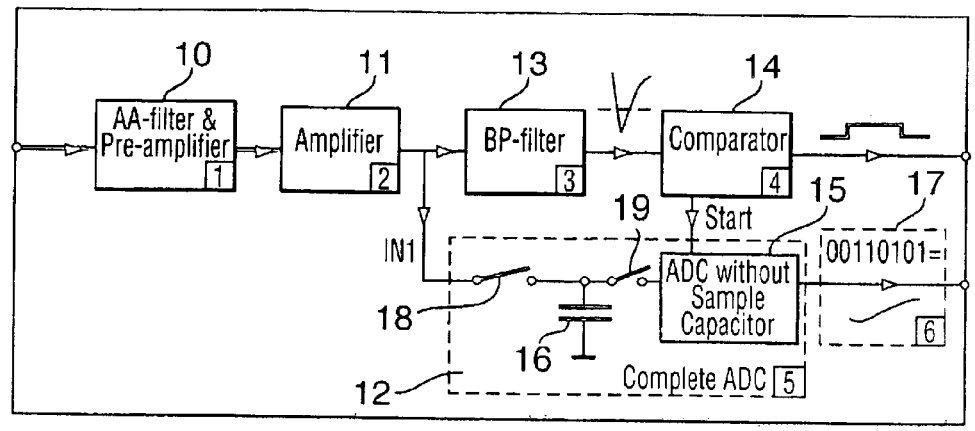
FIG. 1 is a block diagram of a prior art analog-to-digital converter with a single sample-and hold circuit.

The analog-to-digital converter includes a front-end similar to that shown in FIG. 1. The incoming signal is first filtered and amplified and then compared with a threshold level. If the signal exceeds the threshold level, a heartbeat has occurred. As in the case of FIG. 1, the signal output by the ADC is stored in RAM for the doctor to study later when the patient comes to the hospital.

In FIG. 2, the input signal IN1 is selectively connected to an array of sample-and-hold circuits 20 . . . 27, each comprising an input switch IS1 . . . IS8, an output switch OS1 to OS8 and a capacitor C1 to C8.

Any number of sample capacitors can be provided so long as the number is greater than 1, although preferably several are employed in order to store a significant portion of the signal prior to activation of the analog-to-digital converter. A suitable number is eight as shown in FIG. 2.

The present invention works in a manner analogous to a traditional ADC, but with additional circuitry represented by capacitors C2 to C8. In this case of a traditional ADC, only the capacitor C1 would be used. The value to be converted is connected to C1 via IS1 during the sample phase and connected to the rest of the ADC 15 during the evaluation phase via OS1. The switching will in this case as always be controlled by the switch control block 28.

The reshaping analog-to-digital converter operates in two modes: a power saving mode where only the sampling is active and the rest of the ADC 15 is switched off; and a reconstruction mode where the heart signal has activated the reconstruction of the input signal as it existed immediately prior to the generation of an activation signal.

In the power saving mode before start the remaining portion of the ADC 15 is shut off to save power and the switches OS1 to OS8 are kept open. The switches IS1 to IS8 and are controlled by switch control block 28 so that the input signal IN1 is continuously stored in one capacitor after the other at the sample frequency. The input signal is first stored in the first capacitor C1 via switch IS1, then in the capacitor C2 via switch IS2 and so on in a cyclical fashion.

It will be appreciated that if the filtered input signal reaches the trigger level when, for instance, capacitor C1 is charged to the current signal level, and the sample frequency is 2 kHz, then capacitor C2 will contain the signal as it was 3.5 ms ago since the time for each sample is 0.5 ms ($\frac{1}{2000}$ Kz) and the capacitor C2 will hold the sample as it was seven samples earlier (7×0.5=3.5).

When the start or activation signal from comparator 14 goes high, which occurs when the input signal reaches the threshold or trigger level, the analog-to-digital converter changes from power saving mode to reconstruction mode. It then activates the remaining portion of the ADC 15, and the switch control block 28 connects the capacitor C2 to the ADC 15 via the output switch OS2 during the evaluation phase instead of capacitor C1 as it would in a normal ADC. Therefore it converts the value from 3.5 ms earlier in time. At the next sample phase, it connects the input into capacitor C2 via switch IS2 and during the following evaluation phase capacitor C3 is connected to the remaining portion of the ADC 15 via switch OS3 and so on. The result is that the signal shape from 3.5 ms before the triggering event is output from the ADC with 3.5 ms delay and can be stored in a RAM 20 for later investigation by the doctor. The signal continues to be converted with 3.5 ms delay until the block goes back to power saving mode where the remaining portion of the ADC 15 is switched off The switch control block can preferably be made be in the form of a state machine with the above mentioned modes. However for those skilled in art it is clear that a number of possible implementations exist ranging from rather simple structures to micro-controller/micro-processor structures.

The current penalty for storing the samples while waiting for the trigger signal is less than 100 nano-Ampere whereas running the complete ADC continuously takes somewhere between 0.5 to 1 micro-Ampere. For the signal shape to be accurately restored the leakage from the capacitors should preferably be less than 1 pico-Ampere. This is normal in a low power process. For lower demands on signal accuracy and/or higher sample frequency a higher leakage can be tolerated.

It will be seen that the invention permits the shape of the signal prior to activation of the analog-to-digital converter to be stored in RAM for later presentation to the doctor.

I claim:

1. An analog-to-digital converter, comprising:
an input for receiving an analog input signal;
a digitizer for producing a digital output signal, said digitizer being switchable, in response to an activation signal, between a power saving mode, in which said digitizer is inactive, and a reconstruction mode, in which said digitizer is operational;
a circuit element for generating said activation signal in response to a trigger event; a sample-and-hold circuit having a plurality of storage elements, said sample-and-hold circuit storing successive groups of samples of said analog input signal; a first set of switch elements connecting said input to said respective storage elements of said sample-and-hold circuit;
a second set of switch elements connecting said respective storage elements of said sample-and-hold circuit to said digitizer; and
a control element for controlling said first set of switch elements to continually apply incoming samples of said analog input signal in a cyclic fashion to said storage elements, said control element further controlling said second set of switch elements when said digitizer is in said reconstruction mode to sequentially apply said samples of said analog input signal stored in said storage elements to said digitizer with a predetermined delay relative to said incoming samples so as to permit said digitizer to output a portion of said input signal that arrived at said input prior to the occurrence of said activation signal.

2. An analog-to-digital converter as claimed in claim 1, wherein said storage elements each comprise a capacitor.

3. An analog-to-digital converter as claimed in claim 2, comprising eight said capacitors.

4. An analog-to-digital converter as claimed in claim 1, further comprising a comparator for generating said activation signal in response to said input signal reaching a threshold level.

5. An analog-to-digital converter as claimed in claim 1, wherein said control element is a state machine.

6. A method of converting an analog signal to a digital signal, comprising:
feeding successive samples of said analog signal to a sample-and-hold circuit;
storing groups of successive samples of said input signal in said sample-and-hold circuit;
providing a digitizer for producing a digital output signal, said digitizer being switchable, in response to an activation signal, between a power saving mode, in which said digitizer is inactive, and a reconstruction mode, in which said digitizer is operational;
generating said activation signal to switch said digitizer into said reconstruction mode in response to a trigger event; and
after generating said activation signal, sequentially applying said stored samples with a delay of at least one sample period relative to incoming samples to said digitizer so as to permit said digitizer to output a portion of said input signal that arrived at said input prior to the occurrence of said activation signal.

7. A method as claimed in claim 6, wherein said samples are stored in a series of sampling circuits, each connected to said digitizer through respective output switches, and said samples are sequentially applied to said digitizer with a delay by controlling said output switches.

8. A method as claimed in claim 7, wherein said activation signal is generated by comparing said input signal with a predetermined threshold.

9. A method as claimed in claim 8, wherein said sampling circuits each comprise a capacitor.

10. A method as claimed in claim 9, wherein said sampling circuits comprise eight said capacitors.

11. A pacemaker comprising:

a front end for receiving an analog input signal including a comparator for comparing said input signal with a threshold value, said front end generating an activation signal when said input signal reaches said threshold value;

a sample-and-hold circuit including storage elements for storing successive groups of samples of said input signal;

a digitizer for producing a digital output signal, said digitizer being switchable, in response to said activation signal, between a power saving mode, in which said digitizer is inactive, and a reconstruction mode, in which said digitizer is operational; and a control element for sequentially applying incoming samples of said analog input signal in a cyclic fashion to said storage elements, said control element further, when said digitizer is in said reconstruction mode, sequentially applying samples of said analog input signal stored in said storage elements to said digitizer with a predetermined delay relative to said incoming samples so as to permit said digitizer to output a portion of said input signal that arrived at said input prior to the occurrence of said activation signal.

12. A pacemaker as claimed in claim 11, wherein said storage elements are connected to said digitizer through respective output switches controlled by said control element.

13. A pacemaker as claimed in claim 12, wherein said storage elements are each connected to an input through respective input switches controlled by said control element.

14. A pacemaker as claimed in claim 11, further comprising a RAM for storing said digitized version of said input signal as it existed prior to said activation signal.

15. A pacemaker as claimed in claim 11, wherein said control element is a state machine.

* * * * *